United States Patent [19]

Inoue et al.

[11] Patent Number: 5,773,085
[45] Date of Patent: Jun. 30, 1998

[54] METHOD OF MANUFACTURING TERNARY COMPOUND THIN FILMS

[75] Inventors: Yoji Inoue; Katsu Tanaka; Shinji Okamoto; Kikuo Kobayashi, all of Tokyo, Japan

[73] Assignee: Nippon Hoso Kyokai, Tokyo, Japan

[21] Appl. No.: 602,834

[22] PCT Filed: Jul. 4, 1995

[86] PCT No.: PCT/JP95/01337

§ 371 Date: Jun. 12, 1996

§ 102(e) Date: Jun. 12, 1996

[87] PCT Pub. No.: WO96/01549

PCT Pub. Date: Jan. 18, 1996

[30] Foreign Application Priority Data

Jul. 4, 1994 [JP] Japan .................................. 6-152059

[51] Int. Cl.[6] .............................. C23C 14/24; B05D 5/06
[52] U.S. Cl. ..................................... 427/255.2; 427/255.1; 427/248.1; 427/69; 427/66; 427/64; 117/108; 438/603
[58] Field of Search .............................. 427/248.1, 255.1, 427/69, 66, 255.2, 64, 126.1; 117/108; 438/603

[56] References Cited

U.S. PATENT DOCUMENTS

| | | | |
|---|---|---|---|
| 4,770,950 | 9/1988 | Ohnishi | 428/690 |
| 5,505,986 | 4/1996 | Velthaus et al. | 427/66 |
| 5,554,449 | 9/1996 | Tonomura et al. | 428/690 |

FOREIGN PATENT DOCUMENTS

| | | |
|---|---|---|
| 2-65094 | 3/1990 | Japan . |
| 2-269185 | 11/1990 | Japan . |
| 4-121992 | 4/1992 | Japan . |
| 5-65478 | 3/1993 | Japan . |

OTHER PUBLICATIONS

T.E. Peters et al., "Luminescence and Structural Properties of Thiogallate Phosphors $Ce^{+3}$ and $EU^{+2}$–Activated Phosphors. Part I", J. Electrochem. Soc.: Solid–State Science and Technology, Feb. 1972, pp. 230–236.

*Primary Examiner*—Roy V. King
*Attorney, Agent, or Firm*—Oliff & Berridge, PLC

[57] ABSTRACT

One kind of element belonging to I group or II group and one kind of binary compound including one kind of element belonging to III group and one kind of element selected from the group consisting of S, Se, Te and O are evaporated respectively by means of a vacuum vapor deposition method or molecular beam epitaxial method to produce a ternary compound semiconductor material having a low vapor pressure, and the thus produced ternary compound semiconductor material is deposited on a substrate to form a ternary compound semiconductor thin film. Particularly, when a phosphor thin film for electroluminescence emitting blue light is to be grown, an element Sr and a binary compound $Ga_2S_3$ are respectively evaporated by the vacuum evaporation method or molecular beam epitaxial method to deposit a ternary compound semiconductor material $SrGa_2S_4$ on a substrate, and at the same time impurity element Ce forming luminescent center is evaporated such that the ternary compound semiconductor material $SrGa_2S_4$ is doped with the impurity element.

15 Claims, 6 Drawing Sheets

METHOD OF MANUFACTURING TERNARY COMPOUND THIN FILMS

FIELD OF THE INVENTION

The present invention relates to a ternary compound thin film and a method of manufacturing the same, and more particularly relates to a crystal growing technique for forming a thin film of a ternary compound semiconductor material such as $SrGa_2S_4$ and a ternary compound phosphor thin film having a basic substance of said ternary compound semiconductor material by means of the vacuum vapor deposition method or molecular beam epitaxial method (MBE method).

TECHNICAL BACKGROUND $SrGa_2S_4$ is one of the ternary compound semi-conductor material and has a wide band-gap up to 4.4 eV, so that this material may be advantageously used as a basic material of phosphors emitting radiation in a short wavelength region. T. E. Peters et al have reported in "Journal of Electrochemical Society: SOLID STATE SCIENCE AND TECHNOLOGY", 119 (1972), pp.230–236 that a cerium doped $SrGa_2S_4$ ($SrGa_2S_4$ :Ce) powder phosphor emits blue luminescent light having good color purity. However, it is practically difficult to obtain an AC driven thin film electroluminescent device having an ideal stoichiometric ratio (Sr:Ga:S=1:2:4) from this $SrGa_2S_4$ material. When the ideal stoichiometric ratio is not attained, the color purity is deteriorated and the emission efficiency is decreased.

In order to solve the above mentioned problem, Planar Systems Inc., U.S.A. has proposed a thin film manufacturing method, in which a strontium thiogallate $SrGa_2S_4$ thin film is formed by a sputtering method using a target having an excess amount of $Ga_2S_3$ by 3–5% for supplementing elements which will be lost during a film forming process as well as a high temperature annealing process (Japanese Patent Application Laid-open Publication Kokai Hei 5-65478). However, a thin film formed by the sputtering method is amorphous (non-crystal), and thus it is necessary to perform a crystallization process after forming a thin film by means of a high temperature annealing. Therefore, even by this method it is difficult to obtain a phosphor thin film having a high quality of crystallinity. For instance, when the above phosphor is applied to the AC driven thin film electroluminescent device emitting blue light, there were drawbacks that the light emission efficiency is low and the brightness is also low.

A vacuum vapor deposition method in an ultra high vacuum and a molecular beam epitaxial method have been known as a method of manufacturing a thin film having a high degree of crystallinity. In these methods, there are used evaporation sources for particular elements constituting a compound semiconductor material. For instance, when a $SrGa_2S_4$ ternary compound semiconductor thin film is to be formed, strontium metal Sr, gallium metal Ga and sulfur element S are prepared as evaporation sources.

When the $SrGa_2S_4$ ternary compound semiconductor thin film is formed by using particular element evaporation sources, a binding energy between sulfur element S and strontium metal Sr and a binding energy between sulfur element S and gallium metal Ga differ greatly from each other, so that it is difficult to form a thin film having a desired stoichiometric ratio. Further, sulfur element S has a high vapor pressure at a low temperature, so that it is difficult to control a supply amount of sulfur, and further a vacuum system of the film forming apparatus is stained with sulfur.

The present invention has for its object to provide a method of manufacturing, on a substrate, a ternary compound thin film having a good crystal property and having a desired stoichiometric ratio, while the above mentioned problems could be removed.

It is another object of the invention to provide a ternary compound phosphor thin film emitting blue light with a high emission efficiency.

It is still another object of the invention to provide a blue light emitting electroluminescent device which can emit blue light required for a color display.

DISCLOSURE OF THE INVENTION

In order to attain the above objects, according to the invention, a method of manufacturing a ternary compound thin film, characterized in that one kind of element belonging to I group or II group and one kind of binary compound including in combination one kind of element belonging to III group and one kind of element selected from the group consisting of element S, Se, Te and O are evaporated respectively by means of a vacuum vapor deposition method or molecular beam epitaxial method to produce a ternary compound semiconductor material having a low vapor pressure, and the thus produced ternary compound semiconductor material is deposited on a substrate to form a ternary compound semiconductor thin film.

According to the invention, a method of manufacturing a phosphor thin film having a basic substance of a ternary semiconductor material, characterized in that one kind of element belonging to I group or II group and one kind of binary compound including in combination one kind of element belonging to the III group and one kind of element selected from the group consisting of S, Se, Te and O are evaporated respectively by means of a vacuum vapor deposition method or molecular beam epitaxial method to produce a ternary compound semiconductor material having a low vapor pressure, the thus produced ternary compound semiconductor material is deposited on a substrate to form a ternary compound semiconductor thin film, and at the same time, at least one kind of impurity element or compound thereof serving as luminescent center is evaporated such that said ternary compound semiconductor thin film is doped with said impurity element to form a phosphor thin film having a basic substance of the ternary compound semiconductor material.

In an embodiment of the method of manufacturing the ternary compound thin film according to the invention, said element belonging to I group is an element selected from the group consisting of Cu, Ag and Au.

In another embodiment of the method of manufacturing the ternary compound thin film according to the invention, said element belonging to II group is an element selected from the group consisting of Mg, Ca, Sr, Ba, Zn, Cd and Eg.

In another embodiment of the method of manufacturing a ternary thin film according to the invention, said element belonging to III group is an element selected from the group consisting of Al, In and Ga.

According to the invention, a method of manufacturing a ternary compound semiconductor thin film, characterized in that an element Sr and a binary compound $Ga_2S_3$ are evaporated by a vacuum vapor deposition method or molecular beam epitaxial method to produce a ternary compound semiconductor material $SrGa_2S_4$ having a low vapor pressure, and the thus produced ternary compound semiconductor material is deposited on a substrate to grow a ternary compound semiconductor $SrGa_2S_4$ thin film.

In an embodiment of the method of manufacturing the ternary compound semiconductor thin film, upon depositing the ternary compound semiconductor thin film on the substrate, a ratio of a vapor pressure of the binary compound $Ga_2S_3$ to a vapor pressure of the element Sr ($Ga_2S_3$/Sr) is set to a value within a range from about 15 to about 150, and said substrate is heated to a temperature within a range from about 530° C. to about 605° C.

According to the invention, a method of manufacturing a phosphor thin film having a basic substance of a ternary compound semiconductor, characterized in that an element Sr and a binary compound $Ga_2S_3$ are evaporated by a vacuum vapor deposition method or molecular beam epitaxial method to produce a ternary semiconductor material $SrGa_2S_4$ having a low vapor pressure, the thus produced ternary compound semiconductor material is deposited on a substrate to grow a ternary compound semiconductor $SrGa_2S_4$ thin film, and at the same time an impurity element serving as luminescent center is evaporated such that said ternary compound semiconductor thin film is doped with said impurity element to form a phosphor thin film having a basic substance of a ternary compound semiconductor material.

In an embodiment of the method of manufacturing the phosphor thin film having a basic substance of ternary compound semiconductor material, said impurity element serving as luminescent center is an element selected from the group consisting of La, Ce, Pr, Nd, Sm. Eu, Tb, Dy, Ho. Er, Tm, Yb, Mn, Ni, Sn, Pb, F, Cl, Br, I, Li, Na, K, Rb, Cs, P, As, Sb, Bi, Sc, Y and 0.

According to the invention, a method of manufacturing a phosphor thin film for electroluminescence, characterized in that an element selected from the group consisting of Ca, Ba and Mg and a binary compound $Ga_2S_3$ are evaporated by a vacuum vapor deposition method or molecular beam epitaxial method to produce a ternary compound semiconductor material $CaGa_2S_4$ or $BaGa_2S_4$ or $MgGa_2S_4$ having a low vapor pressure, the thus produced ternary compound semiconductor material is deposited on a substrate to form a ternary compound semiconductor thin film, and at the same time an impurity element serving as luminescent center is evaporated such that the ternary compound semiconductor thin film is doped with said impurity element to form a phosphor thin film for electroluminescence having a basic substance of said ternary compound semiconductor material.

According to the invention, a method of manufacturing a phosphor thin film for electroluminescence, characterized in that an element selected from the group consisting of Sz, ca, Ba, and Mg and a binary compound $Ga_2Se_3$ are evaporated by a vacuum vapor deposition method or molecular beam epitaxial method to produce a ternary compound semiconductor material $SrCa_2Se_4$ or $CaGa_2Se_4$ or $BaGa_2Se_4$ or $MgGa_2Se_4$ having a low vapor pressure, the thus produced ternary compound semiconductor material is deposited on a substrate to form a ternary compound semiconductor thin film, and at the same time an impurity element serving as luminescent center is evaporated such that the ternary compound semiconductor thin film is doped with said impurity element to form a phosphor thin film for electroluminescence having a basic substance of said ternary compound semiconductor material.

In the above mentioned method of manufacturing the phosphor thin film for electroluminescence according to the invention, it is preferable that the impurity element serving as luminescent center is a substance selected from the group consisting of Ce, Pr, Sm, Eu, Tb, Dy, Ho, Err Tm, Yb, Mn and halogenides thereof.

According to the invention, a phosphor thin film having a basic substance of a ternary compound semiconductor material, characterized in that a basic substance of a ternary compound is formed by evaporating an element sr and a binary compound $Ga_2S_3$ by a vacuum vapor deposition method or molecular beam epitaxial method to deposit on a substrate a ternary compound semiconductor $SrGa_2S_4$ thin film and by evaporating an impurity element Ce serving as luminescent center such that said ternary compound semiconductor thin film is doped with said impurity element.

According to the invention, an AC driven thin film electroluminescent device emitting blue light and comprising a transparent substrate, a transparent electrode deposited on said transparent substrate, a first insulating film deposited on said transparent electrode, a $SrGa_2S_4$:Ce phosphor thin film deposited on said first insulating film, a second insulating film deposited on said phosphor thin film and a back electrode deposited on said second insulating film, characterized in that said $SrGa_2S_4$ :Ce phosphor thin film is formed by evaporating an element Sr and a binary compound $Ga_2S_3$ by means of a vacuum vapor deposition method or molecular beam epitaxial method to form a ternary compound semiconductor thin film and at the same time an impurity element serving as luminescent center is evaporated such that said ternary compound semiconductor thin film is doped with said impurity element.

In an embodiment of the AC driven electroluminescent device according to the invention, each of said first and second insulating films is formed by an insulating film selected from the group consisting of a laminated film of tantalum oxide ($Ta_2O_5$)/silicon oxide ($SiO_2$), a laminated film of tantalum oxide ($Ta_2O_5$)/silicon oxide ($SiO_2$)/zinc sulfide (ZnS), a silicon nitride ($Si_3N_4$) film, a strontium titanate ($SrTiO_3$) film, a lead zirconium titanate ($PbZr_1-xTi=O_3$:x=0–1) film, a laminated film of strontium titanate ($SrTiO_3$)/silicon nitride ($Si_3N_4$), a laminated film of strontium titanate ($SrTiO_3$)/aluminum oxide ($Al_2O_3$), a barium titanate ($BaTiO_3$) film, a lead titanate ($PbTiO_3$) film, an aluminum titanate ($AlTiO_3$) film, and a laminated film of silicon oxide ($SiO_2$), silicon nitride ($Si_3N_4$) and aluminum oxide ($Al2O_3$). When the insulating film formed by a laminated film including a strontium titanate ($SrTiO_3$) film is used as the insulating film, it is preferable that the strontium titanate film is brought into contact with the phosphor thin film.

BEST MODE OF THE INVENTION

Now the present invention will be explained in detail with reference to embodiments shown in attached drawings.

As an embodiment of the method of manufacturing a ternary compound thin film according to the invention, a method of forming a SrGa$_2$S$_4$ ternary compound thin film on a glass substrate by means of a vacuum vapor deposition method will be first explained.

In the present embodiment, the following reaction is utilized:

Sr+2Ga$_2$S$_3$→SrGa$_2$S$_4$ +2GaS

In this reaction, a vapor pressure of the produced binary compound GaS is high (therefore a vapor pressure of the produced ternary compound SrGa$_2$S$_4$ is low), and thus it is necessary to set a film forming condition such that the ternary compound is evaporated again. In a vacuum vapor deposition device used in the present embodiment, within the device there are arranged a K (Knudsen) cell supplying a vapor of a metal element Sr and a K cell supplying a vapor of a binary compound Ga$_2$S$_3$. A part of the binary compound Ga$_2$S$_3$ is decomposed into GaS and sulfur element S on the heated substrate. At last, one element of Sr and two molecules of Ga$_2$S$_3$ are changed into one molecule of SrGa$_2$S$_4$ and two molecules of GaS. As stated above, since a compound of Ga and S (GaS) has a relatively high vapor pressure, only a desired ternary compound SrGa$_2$S$_4$ can be deposited on the substrate by setting the heating temperature of the glass substrate and a growing rate during the film forming process such that an excessive amount of gallium sulfide is evaporated again.

In order to evaporate an excessive amount of gallium sulfide, a supply amount ratio of Ga$_2$S$_3$ to Sr (Ga$_2$S$_3$/Sr) and the temperature of the substrate during the film forming process are important. When the supply amount ratio is too large and the glass substrate temperature is too low, a part of the decomposed GaS could not be evaporated again, but is remained on the substrate, so that GaS is grown on the substrate. Contrary to this, when the supply amount ratio is low or the substrate temperature is high, shortage of Ga occurs and strontium sulfide SrS is grown.

Figure 1:
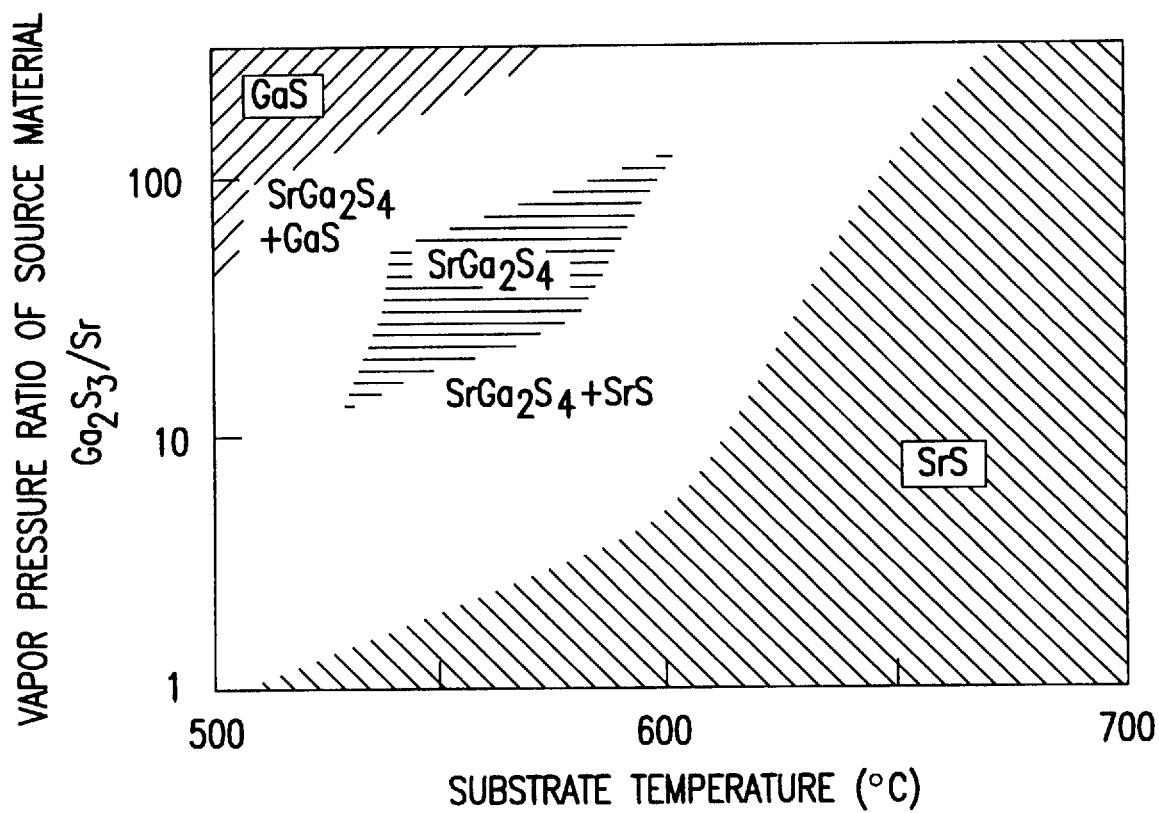
FIG. 1 is a schematic view showing kinds of thin films obtained under conditions determined by a vapor pressure ratio of a source material ($Ga_2S_3$/Sr) and a substrate temperature.

FIG. 1 is a schematic view showing a kind of thin films obtained under various film forming conditions determined by a ratio of vapor pressure of said Ga$_2$S$_3$ and Sr and a temperature of a glass substrate. From the drawing it can be seen that in order to obtain the SrGa$_2$S$_4$ compound semi-conductor thin film, the vapor pressure ratio has to be set a value within a range from about 15 to about 150 and the substrate temperature should be set to a value within a range from about 530° C. to about 605° C.

Figure 2:
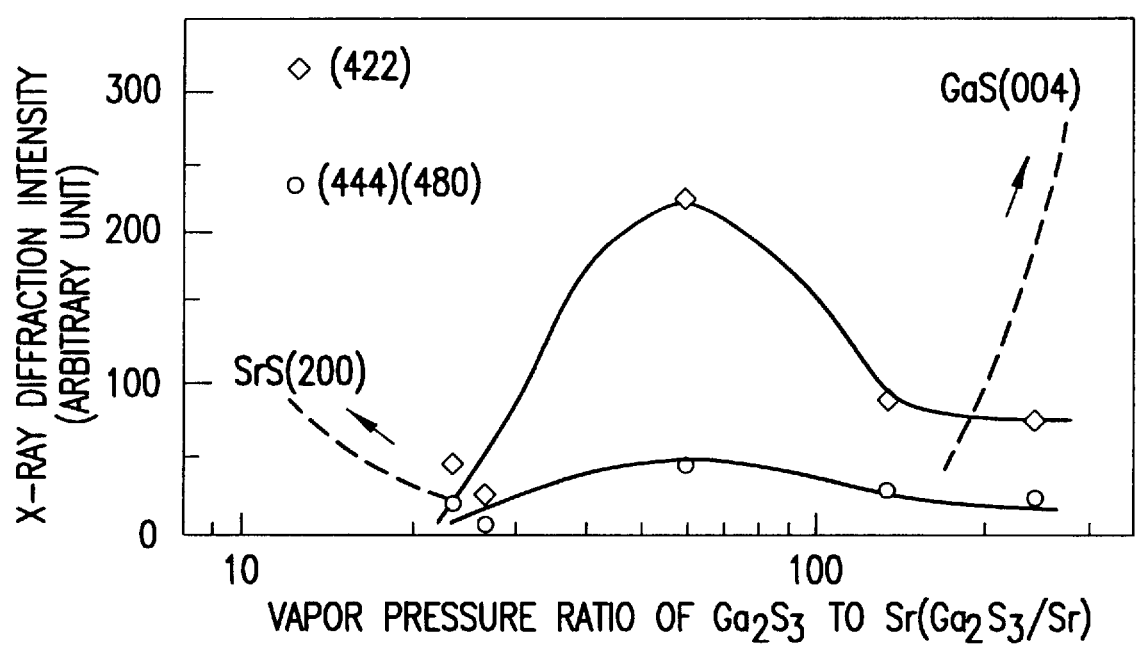
FIG. 2 is a schematic view illustrating a degree of crystallinity of thin films formed by changing the vapor pressure ratio of source materials in the method according to the invention.

FIG. 2 is a graph showing a degree of crystallinity of the thin film, while the substrate temperature of the glass substrate is set to 560° C. and a ratio of the vapor pressure of Ga$_2$S$_3$ to the vapor pressure of Sr (i.e. Ga$_2$S$_3$/Sr) is changed. In the drawing, (422), (444) and (480) denote plane indices of diffraction lines appearing in X-ray diffraction spectrum of SrGa$_2$S$_4$, and an X-ray diffraction intensity represents a degree of crystallinity of the film. The drawing of FIG. 2 indicates that there is an optimum vapor pressure ration under which GAS is evaporated again and only SrGa2S$_4$ grows. This optimum vapor pressure ratio is from 30 to 80. It should be noted that broken lines SrS(200) and GaS(004) denote a peak intensity of (200) plane of SrS and a peak intensity of (004) plane of GaS appearing in the X-ray diffraction spectrum.

Figure 3:
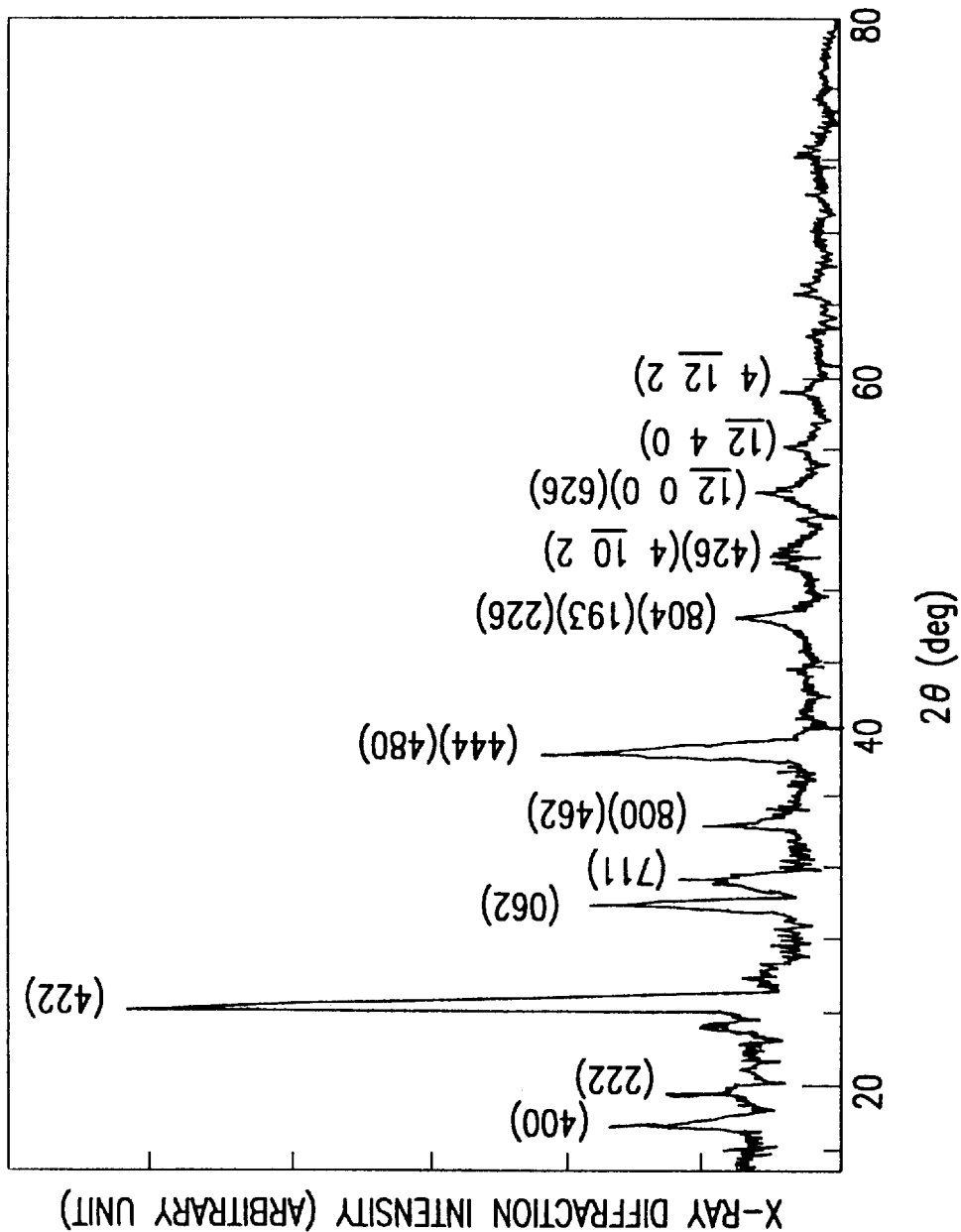
FIG. 3 is a schematic view depicting an X-ray diffraction pattern of a ternary compound semiconductor thin film deposited on a glass substrate formed by the method according to the invention.

FIG. 3 illustrates an X-ray diffraction spectrum of a SrGa$_2$S$_4$ semiconductor thin film which was formed under such a supply amount ratio that only grGa$_2$S$_4$ is deposited (in FIG., abscissa 2θ denotes an X-ray diffraction angle). All peak positions (FIGS. in blankets represent corresponding indices of crystal faces) are identical to those obtained in s SrGa$_2$S$_4$ crystal. This indicates that the SrGa$_2$S$_4$ semi-conductor thin film has a good crystallinity. Further, a growing speed is important in the formation of the SrGa$_2$S$_4$ thin film and intimately relates to a flatness of film. When the growing speed is low, it is possible to obtain a much more flat thin film. In the present embodiment, the growing speed is proportional to the supply amount.

In the embodiment explained so far, the SrGa$_2$S$_4$:Ce ternary compound semiconductor thin film is formed on the glass substrate by the vacuum vapor deposition method. According to the invention, it is also possible to form the ternary compound semiconductor thin film by substituting the glass substrate for a crystal (single-crystalline or poly-crystalline) having a suitable lattice constant. Furthermore, according to the invention a ternary compound semiconductor thin film may be formed by the molecular beam epitaxial method by using the glass substrate or crystalline substrate (single-crystalline or poly-crystalline) having a suitable lattice constant. By using the molecular beam epitaxial method, it is possible to obtain a ternary compound semi-conductor thin film having more excellent crystallinity than the vacuum vapor deposition method.

It should be noted that the method of manufacturing the ternary compound semiconductor thin film is not limited to the above embodiment in which the Sr evaporation source and Ga$_2$S$_3$ evaporation source are used to form the SrGa$_2$S$_4$ ternary compound semiconductor thin film, but may be generalized in the following manner.

That is to say, the metal element Sr evaporation source may be replaced by a metal element Mg, Ca, Ba, Zn, Cd or Hg belonging to group II or a metal element Cu, Ag or Au belonging to group I, and the binary compound Ga$_2$S$_3$ may be replaced by aluminum sulfide Al$_2$S$_3$, indium sulfide In$_2$S$_3$, aluminum selenide Al$_2$Se$_3$, gallium selenide Ga$_2$Se$_3$, indium selenide In$_2$Se$_3$, aluminum telluride Al$_2$Te$_3$, gallium telluride Ga$_2$Te$_3$, indium telluride In$_2$Te$_3$, gallium oxide Ga$_2$O$_3$ or indium oxide In$_2$O$_3$. Then, II-III$_2$-VI$_4$ or I-III-VI$_2$ ternary compound semiconductor thin film can be obtained. Here, aluminum Al, indium In and gallium Ga all belong to the III group metal. It is also possible to use a ternary III-VI compound such as GaS as the evaporation source.

Next a method of forming a phosphor thin film having a basic substance of a ternary compound formed during the formation of the above mentioned ternary compound semi-conductor thin film will be explained.

A K cell serving as an evaporation source of impurity element forming a luminescent center such as rare earth element is additionally provided in the method of manufac-turing the ternary compound semiconductor thin film by the vacuum evaporation method or molecular beam epitaxial method, and a small amount of a vapor of said impurity element is supplied, so that the ternary compound semiconductor thin film is doped with said impurity element to form a phosphor thin film having a high luminescent efficiency. The impurity dopant may be an element selected from the group consisting of La, Ce, Pr, Nd, Sm, Eu, Tb, Dy, Ho, Er, Tm, Yb, Mn, Ni, Sn, Pb, F, Cl, Br, I, Li, Na, K, Rb, Cs, P, As, Sb, Bi, Sc, Y and O. According to the invention, it is particularly preferable to use the impurity dopant forming the luminescent center selected from the group consisting of Ce, Pr, Sm, Eu, Tb, Dy, Ho, Er, Tm, Yb, Mn and halogenides of these elements. As will be explained later, when use is made Ce, a phosphor thin film emitting blue light is obtained. When use is made of Pr, Eu, Tb, Er or Mn, it is possible to attain a phosphor thin film emitting green light, when Nd or Sm is used, a phosphor thin film emitting orange light is obtained, when Dy is used, a phosphor thin film emitting yellow light is obtained, when Ho is used, a phosphor thin film emitting green white light is attained, and when TM is used as the impurity dopant, it is possible to obtain a phosphor thin film emitting red light.

Particularly, the cerium doped strontium thiogallate $SrGa_2S_4$:Ce can emit blue light having a good chromaticity and also has a high emission efficiency, and therefore this phosphor thin film may be utilized in a luminescent display panel and AC driven electroluminescent device.

Figure 4:
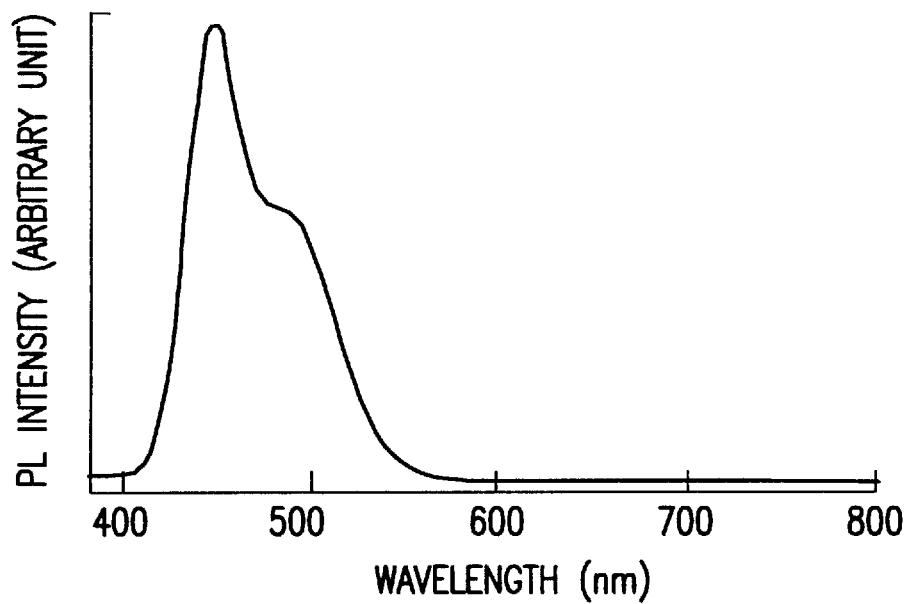
FIG. 4 is a photoluminescence spectrum of the phosphor thin film (strontium thiogallate $SrGa_2S_4$:Ce) formed by adding a cerium element Ce to a ternary compound semiconductor $SrGa_2S_4$) in the method according to the invention.

FIG. 4 shows a photoluminescence spectrum of the $SrGa_2S_4$:Ce phosphor thin film manufactured by the method according to the invention. A peak wavelength of luminescence is 450 nm within a blue region and its chromaticity situates at a position of x=0.142, y=0.129 on the CIE chromaticity diagram, said position being substantially identical with blue phosphor used in current television display tubes. Therefore, it is possible to realize a phosphor color display panel by using the phosphor thin film for emitting blue light.

Figure 5:
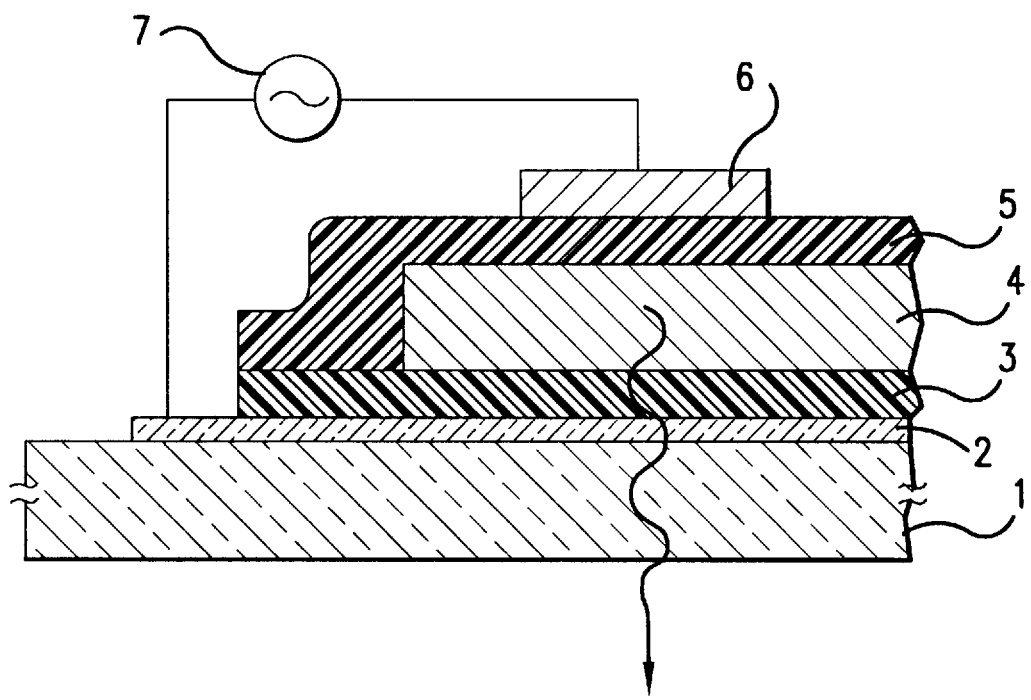
FIG. 5 is a cross sectional view illustrating the AC driven thin film electroluminescent device using the $SrGa_2S_4$;Ce phosphor thin film formed by the method according to the invention.
Figure 6:
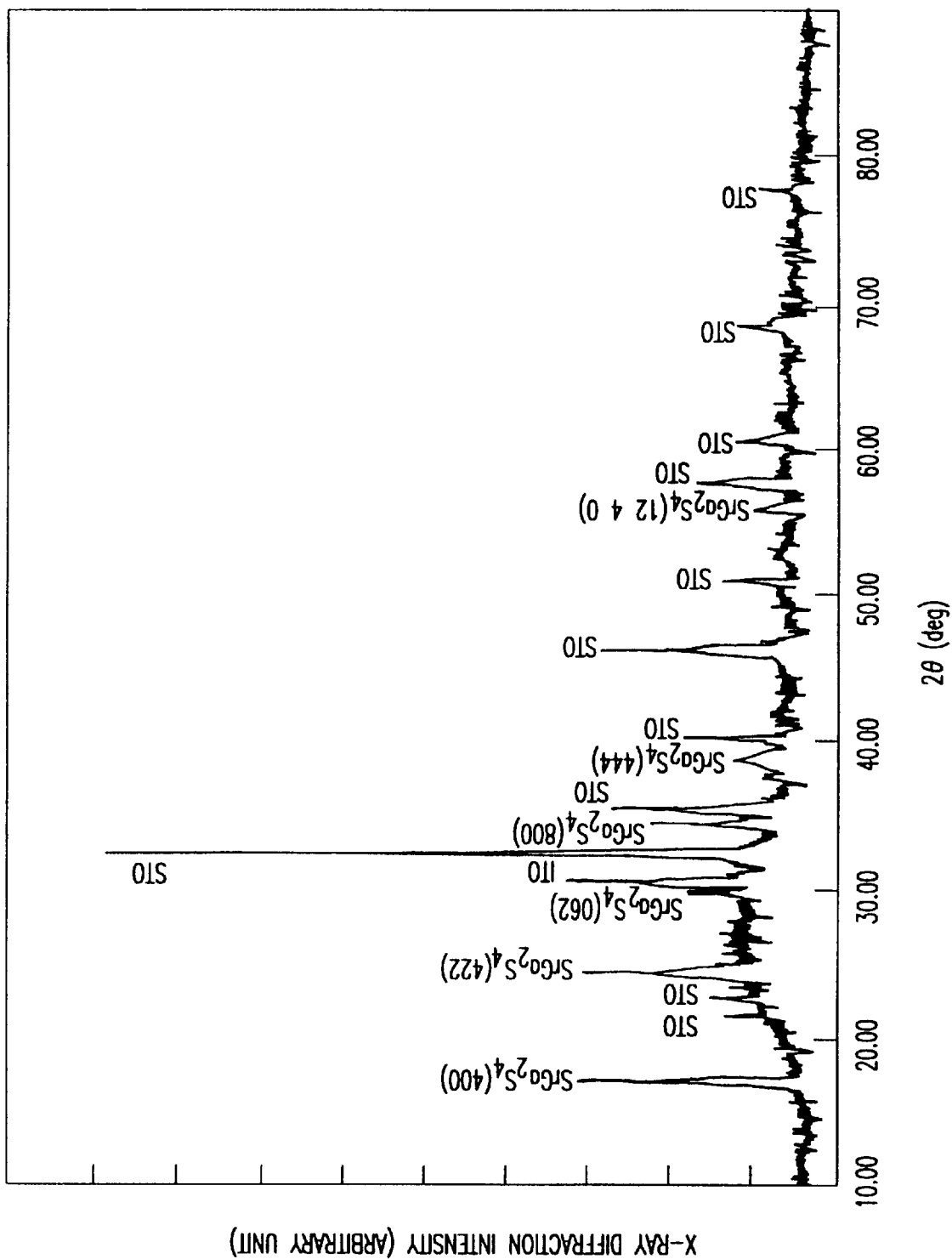
FIG. 6 is a schematic view depicting an X-ray diffraction pattern of the SrGa$_2$S$_4$:Ce phosphor thin film in said AC driven thin film electroluminescent device.

FIG. 5 illustrates the construction of the AC driven thin film electroluminescent device (hereinafter refereed to EL device). The EL device of the present embodiment was manufactured in the following manner. On a glass substrate 1 were deposited a transparent electrode 2 of tin added indium oxide (ITO) and an insulating film 3 having a thickness of 5000 Angstroms, successively. Then, a $SrGa_2S_4$:Ce phosphor thin film 4 having a thickness of 5000 Angstroms was formed by performing the vacuum vapor deposition under conditions that the substrate temperature is set to 530–560° C., a vapor pressure ratio $Ga_2S_3$/Sr is set to 20–60 and the growing speed is set to 10–100 Angstroms/minute. Under said film forming conditions, $SrGa_2S_4$ (400), (800) or (422) orientation was recognized as a main crystal orientation as shown in FIG. 6. Then, an insulating film 5 having a thickness of about 5000 Angstroms was formed, and a back electrode 6 made of aluminum was deposited on the insulating film. When an AC voltage V was applied from an AC voltage source 7 across the transparent electrode 2 and the back electrode 6, blue light was emitted by the EL device.

The above mentioned insulating films 3 and 5 may be formed by an insulating film selected from the group consisting of a laminated film of tantalum oxide ($Ta_2O_5$)/silicon oxide ($SiO_2$), a laminated film of tantalum oxide ($Ta_2O_5$)/silicon oxide ($SiO_2$)/zinc sulfide (ZnS), a silicon nitride ($Si_3N_4$) film, a strontium titanate ($SrTiO_3$) film, a lead zirconium titanate ($PbZr_{1-x}Ti_xO_3$:x=0–1) film, a laminated film of strontium titanate ($SrTiO_3$)/silicon nitride ($Si_3N_4$), a laminated film of strontium titanate ($SrTiO_3$)/aluminum oxide ($Al_2O_3$). Furthermore, the insulating film may be formed by a barium titanate ($BaTiO_3$) film, a lead titanate ($PbTiO_3$) film, an aluminum titanate ($AlTiO_3$) film or a laminated film of silicon oxide ($SiO_2$), silicon nitride ($Si_3N_4$) and aluminum oxide ($Al_2O_3$). It has been experimentally confirmed that when a laminated film including the strontium titanate is used as the insulating films 3 and 5, it is possible to obtain the EL device having better electroluminescent properties by constructing the element such that the phosphor thin film 4 is brought into contact with the strontium titanate film.

The above mentioned glass substrates were made of NA-40 glass (HOYA company) and 7059 glass (CONING company). In case of manufacturing the $SrGa_2S_4$:Ce phosphor thin film 4 by the method according to the invention, the substrate temperature is set to 530–560° C. which is lower than heat-resistance temperatures of the NA-40 and 7059 glasses constituting the substrate 1, and further it is no more necessary to perform a high temperature annealing process after growing the thin film, so that ordinary glass substrates which have been used as substrates of EL devices may be utilized. Therefore, it is no more necessary to use expensive glass substrates having high heat-resisting temperature which have been used in the known manufacturing methods requiring the high temperature annealing, and thus a manufacturing cost of the above mentioned EL device can be decreased.

Figure 7:
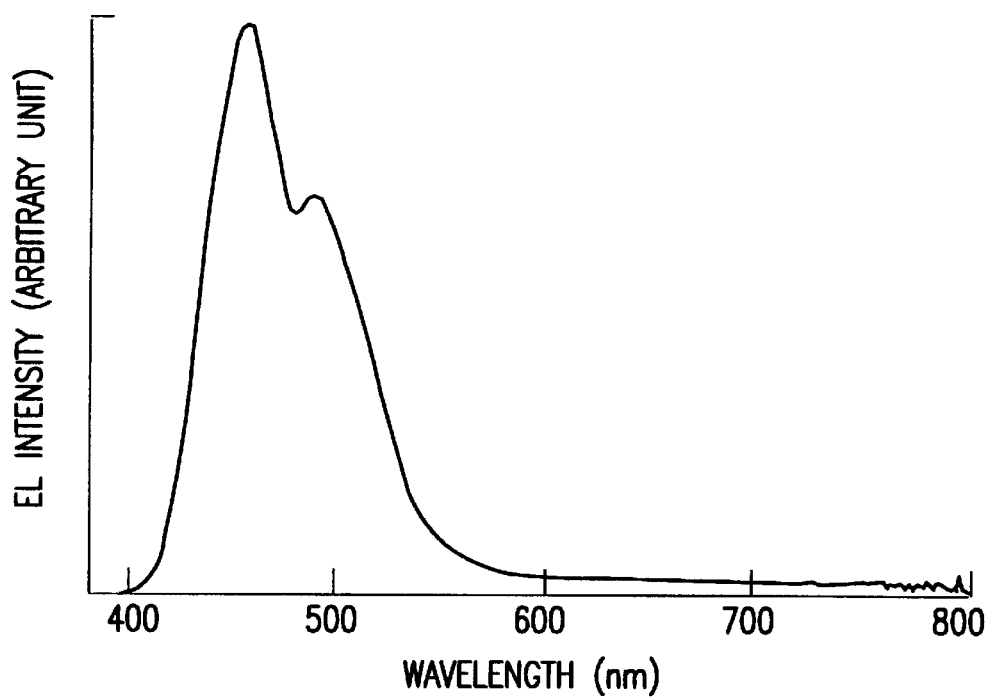
FIG. 7 is an electroluminescent spectrum of the AC driven thin film electroluminescent device using the SrGa$_2$S$_4$;Ce phosphor thin film.
Figure 8:
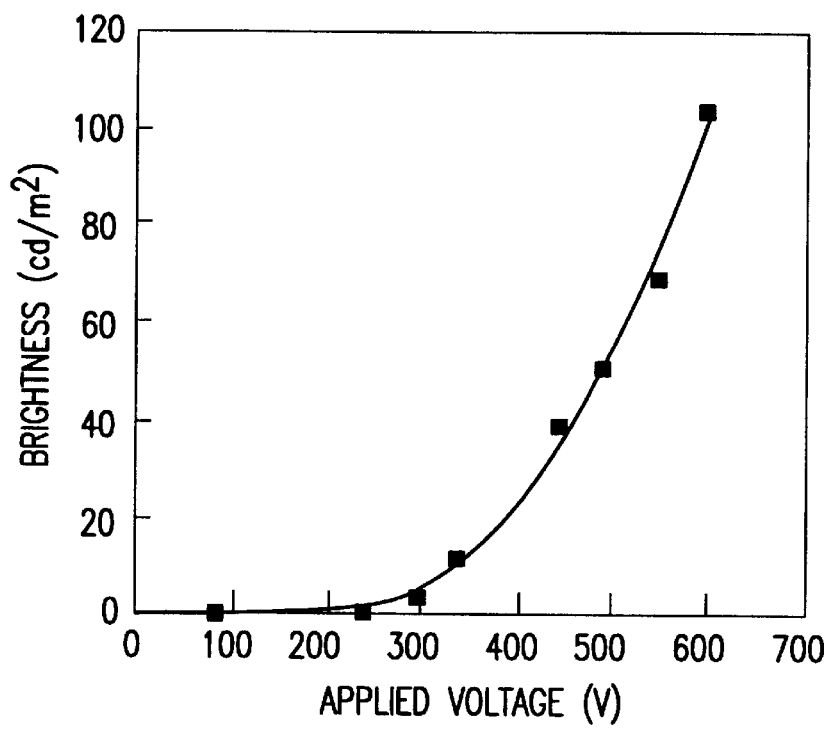
FIG. 8 is a graph representing a relationship between an applied voltage and an emission intensity of the AC driven thin film electroluminescent device using the SrGa$_2$S$_4$;Ce phosphor thin film manufactured by the method according to the invention.

FIG. 7 shows a luminescent spectrum of the EL device using the $SrGa_2S_4$:Ce phosphor thin film manufactured by the method according to the invention. The El element having the luminescence layer constructed by the $SrGa_2S_4$:Ce phosphor thin film also has a luminescent peak wavelength of 450 nm within a blue region and its chromaticity situates at a point represented by x=0.14 and y=0.12 on the CIE chromaticity coordinates. FIG. 8 depicts an emission intensity of the EL element with respect to an applied voltage, in said EL element the strontium titanate insulating films 3 and 5 being brought into contact with said $SrGa_2S_4$;Ce phosphor thin film 4. In this EL device, the emission intensity higher than 100 cd/$M^2$ (driving frequency 1 KHz) can be attained. The color purity and emission intensity of the above EL device are sufficiently high for satisfying necessary properties for blue luminescence in a color display, and therefore it is possible to realize a color EL display having an excellent color reproduction by using the above EL device.

In the above explained embodiment, the $SrGa_2S_4$:Ce phosphor thin film is formed on the glass substrate by the vacuum vapor deposition method, but according to the invention the glass substrate may be replaced by a crystal substrate (single-crystalline or poly-crystalline) having a suitable lattice constant and a phosphor thin film having a basic substance of a ternary compound semiconductor material. Moreover, according to the invention, a phosphor thin film having a basic substance of a ternary compound semiconductor material may be manufactured by the molecular beam epitaxial method by using the above mentioned glass substrate or crystal substrate (single-crystalline or poly-crystalline) having a suitable lattice constant. By using the molecular beam epitaxial method, it is possible to form a phosphor thin film having a more excellent crystallinity than the vacuum evaporation method.

POSSIBILITY OF INDUSTRIAL UTILIZATION

In the method according to the invention, it is possible to form the ternary compound thin film having a desired stoichiometric ratio and a higher degree of crystallinity as compared with the known method of forming ternary compound thin films in which particular elements constituting the ternary compound are evaporated from respective evaporation sources. Further, according to the invention, it is possible to form the phosphor thin film which can emit blue light at a high efficiency. By using such a phosphor thin film, it is possible to realize an electroluminescent device having blue light emitting property which sufficiently satisfies a necessary property for a color display.

We claim:

1. A method of manufacturing a ternary compound semiconductor thin film, characterized in that one kind of element belonging to IB group or IIB group and one kind of binary compound including one kind of element belonging to IIIB group and one kind of element selected from the group consisting of S, Se, Te and O are evaporated respectively by means of a vacuum vapor deposition method or molecular beam epitaxial method to produce a ternary compound semiconductor material having a low vapor pressure, and said ternary compound semiconductor material is deposited on a substrate to form said ternary compound semiconductor thin film.

2. A method of manufacturing a phosphor thin film of a primarily ternary compound semiconductor material, characterized in that one kind of element belonging to IB group or IIB group and one kind of binary compound consisting of one kind of element belonging to the IIIB group and one kind of element selected from the group consisting of S, Se, Te and O are evaporated respectively by means of a vacuum vapor deposition method or molecular beam epitaxial method to produce a ternary compound semiconductor material having a low vapor pressure, the thus produced ternary compound semiconductor material is deposited on a substrate to form a ternary compound semiconductor thin film, and at the same time at least one kind of impurity element or a compound thereof serving as luminescent center is evaporated such that the ternary compound semiconductor thin film is doped with said impurity element to form said phosphor thin film of the primarily ternary compound semiconductor material.

3. A method as claimed in claim 2, characterized in that said element belonging to IIIB group is an element selected from the group consisting of Al, In and Ga.

4. A method as claimed in claim 2, characterized in that said impurity element serving as luminescent center is an element selected from the group consisting of La, Ce, Pr, Nd, Sm, Eu, Tb, Dy, Ho, Er, Tm, Yb, Mn, Ni, Sn, Pb, F, Cl, Br, I, Li, Na, K, Rb, Cs, P, As, Sb, Bi, Sc, Y and O.

5. A method of manufacturing a ternary compound semiconductor thin film, characterized in that only an element Sr and a binary compound $Ga_2S_3$ are evaporated by a vacuum vapor deposition method or molecular beam epitaxial method to produce a ternary compound semiconductor material $SrGa_2S_4$ having a low vapor pressure, and the thus produced ternary compound semiconductor material is deposited on a substrate to grow a ternary compound semiconductor $SrGa_2S_4$ thin film.

6. A method as claimed in claim 5, characterized in that upon depositing the ternary compound semiconductor thin film on the substrate, a ratio of a vapor pressure of the binary compound $Ga_2S_3$ to a vapor pressure of the element Sr ($Ga_2S_3/Sr$) is set to a value within a range from about 15 to about 150, and said substrate is heated to a temperature within a range from about 530° C. to about 605° C.

7. A method of manufacturing an electroluminescent phosphor thin film of a primarily ternary compound semiconductor material, characterized in that only an element Sr and a binary compound $Ga_2S_3$ are evaporated by a vacuum vapor deposition method or molecular beam epitaxial method to produce a ternary compound semiconductor material $SrGa_2S_4$ having a low vapor pressure, the thus produced ternary compound semiconductor material is deposited on a substrate to grow a ternary compound semiconductor $SrGa_2S_4$ thin film, and at the same time a cerium element or a cerium halogenide is evaporated as impurity serving as luminescent center such that the ternary compound semiconductor thin film is doped with said impurity to form said phosphor thin film of the primarily ternary compound semiconductor material, wherein a temperature of the substrate is set to 530–560° C., and a ratio of a vapor pressure of the binary compound $Ga_2S_3$ to that of the element Sr($Ga_2S_3/Sr$) is set to 20–60.

8. A method as claimed in claim 7, characterized in that said cerium or cerium halogenide impurity serving as luminescent center is replaced by a substance selected from the group consisting of Pr, Sm, Eu, Tb, Dy, Ho, Er, Tm, Yb, Mn and halogenides thereof.

9. A method as claimed in claim 7, characterized in that a temperature of the substrate, a ratio of a vapor pressure of the binary compound $Ga_2S_3$ to that of the element Sr ($Ga_2S_3/Sr$) and a film growing speed are selected such that an orientation (400) or (800) or (422) of said ternary compound semiconductor material $SrGa_2S_4$ exhibits as a main crystal orientation.

10. A method as claimed in claim 9, characterized in that the film growing speed is set to 10–100 Angstroms/minute.

11. A method as claimed in claim 7, characterized in that upon depositing said ternary compound semiconductor material $SrGa_2S_4$ thin film on the substrate, a substrate having a laminated film of strontium titanate ($SrTiO_3$)/silicon nitride ($Si_3N_4$) or a laminated film of strontium titanate ($SrTiO_3$)/aluminum oxide ($Al_2O_3$) is used such that said ternary compound semiconductor material film is brought into contact with said strontium titanate thin film.

12. A method of manufacturing a phosphor thin film for electroluminescence, characterized in that only an element selected from the group consisting of Ca, Ba and Mg and a binary compound $Ga_2S_3$ are evaporated by a vacuum vapor deposition method or a molecular beam epitaxial method to produce a ternary compound semiconductor material $CaGa_2S_4$ or $BaGa_2S_4$ or $MgGa_2S_4$ having a low vapor pressure, the thus produced ternary compound semiconductor material is deposited on a substrate to form a ternary compound semiconductor material thin film, and at the same time an impurity element serving as luminescent center is evaporated such that the ternary compound semiconductor material thin film is doped with said impurity element to form said phosphor thin film for electroluminescence, wherein said impurity element serving as luminescent center is a substance selected from the group consisting of Pr, Sm, Tb, Dy, Ho, Er, Tm, Yb, Mn and halogenides thereof.

13. A method as claimed in claim 12, characterized in that upon depositing said thin film of the ternary compound semiconductor material $CaGa_2S_4$, $BaGa_2S_4$ or $MgGa_2S_4$ on the substrate, a substrate having a strontium titanate ($SrTiO_3$) thin film formed on a surface thereof is used such that said ternary compound semiconductor material thin film is brought into contact with the strontium titanate thin film.

14. A method of manufacturing a phosphor thin film for electroluminescence, characterized in that only an element selected from the group consisting of Sr, Ca, Ba and Mg and a binary compound $Ga_2Se_3$ are evaporated by a vacuum vapor deposition method or a molecular beam epitaxial method to produce a ternary compound semiconductor material $SrGa_2Se_4$ or $CaGa_2Se_4$ or $BaGa_2Se_4$ or $MgGa_2Se_4$ having a low vapor pressure, the thus produced ternary compound semiconductor material is deposited on a substrate to form a ternary compound semiconductor material thin film, and at the same time an impurity substance serving as luminescent center is evaporated such that the ternary compound semiconductor material thin film is doped with said impurity substance to form said phosphor thin film for electroluminescence, wherein said impurity substance serving as luminescent center is selected from the group consisting of Pr, Sm, Tb, Dy, Ho, Er, Tm, Yb, Mn and halogenides thereof.

15. A method as claimed in claim 14, characterized in that upon depositing said ternary compound semiconductor material $SrGa_2Se_4$ or $CaGa_2Se_4$ or $BaGa_2Se_4$ or $MgGa_2Se_4$, a substrate having a strontium titanate ($SrTiO_3$) thin film formed on a surface thereof is used such-that said ternary compound semiconductor thin film is brought into contact with said strontium titanate thin film.

* * * * *